(12) United States Patent
Matsubara

(10) Patent No.: US 9,735,381 B2
(45) Date of Patent: Aug. 15, 2017

(54) THIN FILM TRANSISTOR ARRAY AND MANUFACTURING METHOD OF THE SAME

(71) Applicant: TOPPAN PRINTING CO., LTD., Taito-ku (JP)

(72) Inventor: Ryohei Matsubara, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 0 days.

(21) Appl. No.: 15/082,078

(22) Filed: Mar. 28, 2016

(65) Prior Publication Data

US 2016/0211474 A1 Jul. 21, 2016

Related U.S. Application Data

(63) Continuation of application No. PCT/JP2014/004564, filed on Sep. 4, 2014.

(30) Foreign Application Priority Data

Sep. 27, 2013 (JP) .................................. 2013-202152

(51) Int. Cl.
*H01L 51/05* (2006.01)
*H01L 27/12* (2006.01)
(Continued)

(52) U.S. Cl.
CPC .... *H01L 51/0545* (2013.01); *G02F 1/136227* (2013.01); *H01L 27/1288* (2013.01);
(Continued)

(58) Field of Classification Search
CPC combination set(s) only.
See application file for complete search history.

(56) References Cited

U.S. PATENT DOCUMENTS 9,508,755 B2 * 11/2016 Kong .................. H01L 27/1248
2008/0239189 A1 10/2008 Hatta et al.
(Continued)

FOREIGN PATENT DOCUMENTS

JP 2008-270744 A 11/2008
JP 2009-157069 A 7/2009
(Continued)

OTHER PUBLICATIONS

International Search Report issued Dec. 2, 2014 in PCT/JP2014/004564, filed Sep. 4, 2014 (with English translation).
(Continued)

*Primary Examiner* — Mamadou Diallo
(74) *Attorney, Agent, or Firm* — Oblon, McClelland, Maier & Neustadt, L.L.P.

(57) ABSTRACT

A thin film transistor array includes thin film transistors positioned in a matrix, each of the thin film transistors including a substrate, a gate electrode formed on the substrate, a gate insulation layer formed on the gate electrode, a source electrode formed on the gate insulation layer, a drain electrode formed on the gate insulation layer, a pixel electrode formed on the gate insulation layer and connected to the source electrode and the drain electrode, a semiconductor layer formed between the source electrode and the drain electrode, an interlayer insulation film covering the source electrode, the drain electrode, the semiconductor layer and a portion of the pixel electrode, and an upper pixel electrode formed on the interlayer insulation film and connected to the pixel electrode. The interlayer insulation film has one or more concave portions and one or more via hole portions.

19 Claims, 8 Drawing Sheets

(51) Int. Cl.
*G02F 1/1362* (2006.01)
*H01L 51/10* (2006.01)
*H01L 27/32* (2006.01)

(52) U.S. Cl.
CPC ...... *H01L 27/1292* (2013.01); *H01L 27/3258* (2013.01); *H01L 51/105* (2013.01); *H01L 2227/323* (2013.01)

(56) References Cited

U.S. PATENT DOCUMENTS

| | | |
|---|---|---|
| 2009/0286361 A1 | 11/2009 | Kawashima |
| 2010/0102335 A1 | 4/2010 | Takagi et al. |
| 2010/0188592 A1 | 7/2010 | Tanaka et al. |
| 2012/0280238 A1 | 11/2012 | Kimura |
| 2012/0322334 A1 | 12/2012 | Kurihara et al. |
| 2013/0056710 A1 | 3/2013 | Oh et al. |
| 2013/0099221 A1 | 4/2013 | Kawamura et al. |
| 2013/0119383 A1 | 5/2013 | Nomoto |

FOREIGN PATENT DOCUMENTS

| | | |
|---|---|---|
| JP | 2011-037999 A | 2/2011 |
| JP | 2013-004649 A | 1/2013 |
| JP | 2013-076739 A | 4/2013 |
| JP | 2013-105950 A | 5/2013 |

OTHER PUBLICATIONS

European Search Report dated May 8, 2017 in corresponding EP Application No. 14847642.7 filed Sep. 4, 2014.

\* cited by examiner

THIN FILM TRANSISTOR ARRAY AND MANUFACTURING METHOD OF THE SAME

CROSS-REFERENCE TO RELATED APPLICATIONS

The present application is a continuation of International Application No. PCT/JP2014/004564, filed Sep. 4, 2014, which is based upon and claims the benefits of priority to Japanese Application No. 2013-202152, filed Sep. 27, 2013. The entire contents of these applications are incorporated herein by reference.

BACKGROUND OF THE INVENTION

Field of the Invention

The present invention relates to a thin film transistor array and a manufacturing method of the same.

Discussion of the Background

Due to the remarkable development of information technology, nowadays, information is frequently transmitted and received with laptop computers or portable information terminals. It is common knowledge that a ubiquitous society enabling information to be exchanged anywhere will be attained in the near future. In such a society, a lighter and slim information terminal is desirable.

Currently, as a semiconductor material, silicon based materials are mainly employed and, as a manufacturing method, photolithography is generally used.

In recent years, printable electronics in which an electrical component is manufactured by using a printing technique are attracting attention. By using the printing technique, the following advantages can be attained, that is, equipment cost and manufacturing cost are reduced compared to using the photolithography and, since a vacuum and high temperature environment are not necessary, a plastic substrate can be used. The printing process efficiently utilizes materials and does not require a development process and an etching process, producing a smaller amount of waste liquid. Accordingly, the environmental load caused by the printing method can be kept low.

On the other hand, the printing process is likely to have low pattern definition and low alignment accuracy compared to the photolithography. In particular, in the case where a thick film having a thickness of the order of several micrometers is required, screen printing is often used. However, a high definition pattern is difficult to form because of fluidity of paste.

As a printing method having resolution higher than that of screen printing, a gravure offset printing can be used (e.g., PTL 1).

In the gravure offset printing, a pattern is formed via a silicone blanket. When the paste is transferred onto the silicone blanket from an intaglio, solvent is absorbed by the blanket to lower the fluidity. As a result, the resolution is improved.

However, in the case where a pattern-formed region is wider than a non-formed region such as in an interlayer insulation film pattern, the amount of solvent absorbed by the silicone blanket increases, causing a change in the time taken for lowering the fluidity and lowering of the alignment accuracy due to swelling of the blanket. Also, when forming a pattern having via holes penetrating therethrough, a doctoring is applied, by a blade, to an intaglio in which protrusions are formed corresponding to the via holes. Therefore, there is a concern that the blade may be bent due to a small number of contacts between the intaglio and the blade, and the protrusions may be chipped when the blade contacts the discontinuous protrusions.

PTL1: JP-A-2011-37999

SUMMARY OF THE INVENTION

According to one aspect of the present invention, a thin film transistor array includes thin film transistors positioned in a matrix, each of the thin film transistors including a substrate, a gate electrode formed on the substrate, a gate insulation layer formed on the gate electrode, a source electrode formed on the gate insulation layer, a drain electrode formed on the gate insulation layer, a pixel electrode formed on the gate insulation layer and connected to the source electrode and the drain electrode, a semiconductor layer formed between the source electrode and the drain electrode, an interlayer insulation film covering the source electrode, the drain electrode, the semiconductor layer and a portion of the pixel electrode, and an upper pixel electrode formed on the interlayer insulation film and connected to the pixel electrode. The interlayer insulation film has one or more concave portions and one or more via hole portions.

According to another aspect of the present invention, a method of manufacturing a thin film transistor array includes forming a gate electrode on a substrate, forming a gate insulation layer on the gate electrode, forming a source electrode on the gate insulation layer, forming a drain electrode on the gate insulation layer, forming a pixel electrode on the gate insulation layer such that the pixel electrode is connected to the drain electrode, forming a semiconductor layer between the source electrode and the drain electrode, forming an interlayer insulation film such that the interlayer insulation film covers the source electrode, the drain electrode, the semiconductor layer, and a portion of the pixel electrode, and forming an upper pixel electrode on the interlayer insulation film such that the upper pixel electrode is connected to the pixel electrode. The forming of the interlayer insulation film comprises performing a gravure offset printing with an intaglio having one or more convex portions and one or more protruding portions such that the one or more convex portions form one or more concave portions and the one or more protruding portions form one or more via hole portions at corresponding positions in the interlayer insulation film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
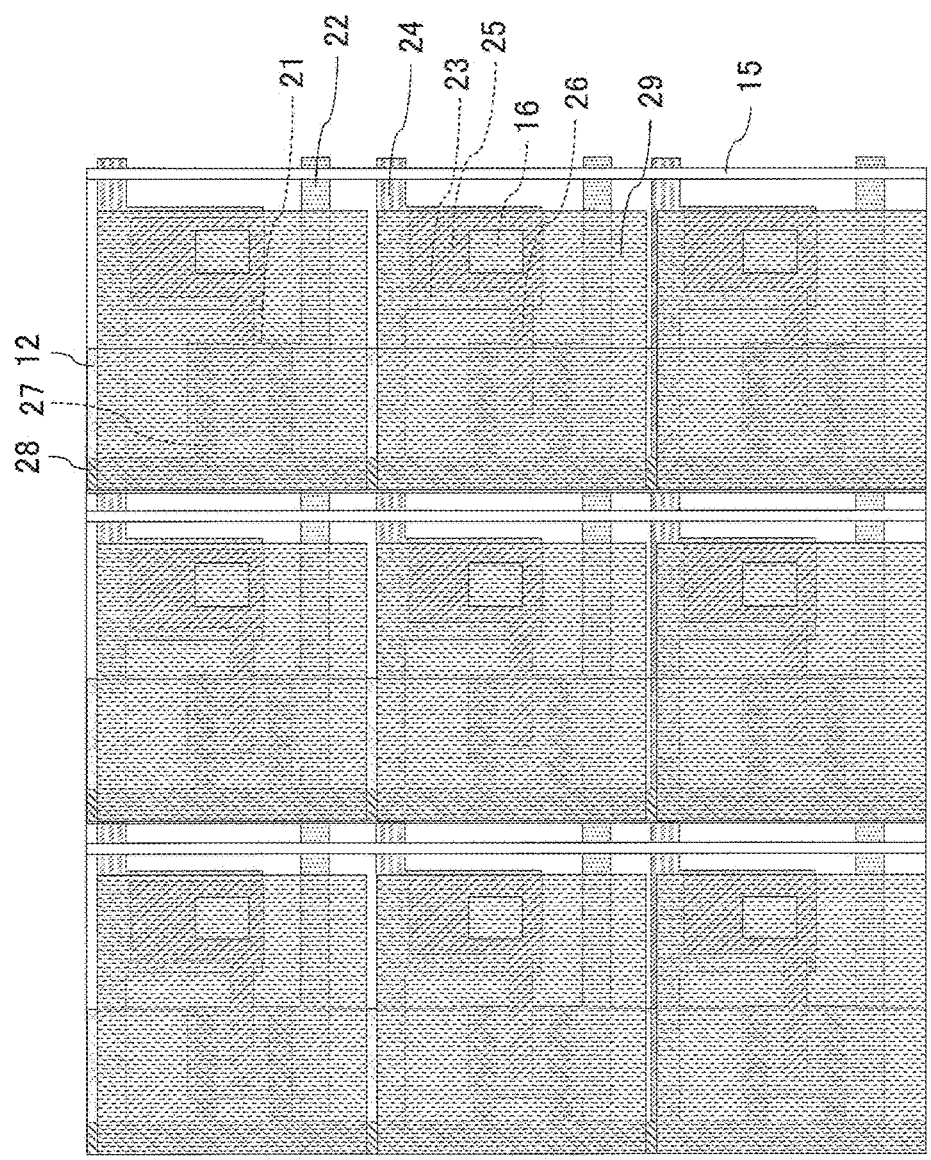
FIG. 1 is a plan view showing an overall configuration of a first thin film transistor array of an example according to an embodiment of the present invention.

The embodiments will now be described with reference to the accompanying drawings, wherein like reference numerals designate corresponding or identical elements throughout the various drawings.

A thin film transistor array according to the present embodiment is provided with thin film transistors arranged in a matrix, each including: a gate electrode formed on a substrate; a gate insulation layer formed on the gate electrode; a source electrode and a drain electrode connected to a pixel electrode, being formed on the gate insulation layer; a semiconductor layer formed between the source electrode and the drain electrode, extending parallel, for example, to the source electrode; an interlayer insulation film formed so as to cover the source electrode, the drain electrode, the semiconductor layer and a portion of the pixel electrode; and an upper pixel electrode formed on the interlayer insulation film, being connected to the pixel electrode, in which the gate electrode is connected to a gate wiring and the source electrode is connected to a source wiring. Further, the interlayer insulation film has a portion of which the thickness is reduced to be in a thin film shape, the portion being formed at least a part of a boundary region between the thin film transistors. Alternatively, the interlayer insulation film has an opening that reaches a lower layer. Each of the portions of which the thickness is reduced to be in a thin film shape and the opening forms a concave portion in the interlayer insulation film. The upper pixel electrode can be formed between the concave portions in a plan view of the thin film transistor array, such as in a region between adjacent concave portions having a stripe shape which will be described later or in a region surrounded by concave portions having a lattice shape which will be described later.

In the embodiments of the present invention, a flexible substrate is desirably used as a substrate having insulation properties. As a material generally used, for example, plastic materials including polyethylene terephthalate (PET), polyimide, polyethersulfone (PES), polyethylene naphthalate (PEN) and polycarbonate can be used. A glass substrate such as quartz or a silicon substrate can be used as a substrate having insulation properties. However, considering reduction in thickness and weight and achievement of flexibility, a plastic substrate is preferably used. Also, considering the temperature used for manufacturing processes, PEN or polyimide is desirably used as a substrate.

In the embodiments according to the present invention, the materials used for electrodes are not specifically limited. Generally the materials include thin films made of metals or oxide such as gold, platinum, nickel and indium tin oxide, or a solution in which a conductive polymer including poly (ethylenedioxythiphene)/polystyrene sulfonate (PEDOT/PSS) and polyaniline or metal colloidal particle such as gold or silver or nickel are dispersed, or a thick film paste using metal particles such as silver as a conductive material. The method of forming the electrodes is not specifically limited, but dry film-forming such as deposition or sputtering may be used. However, considering flexibility and cost reduction, wet film-forming is desirably used, including screen printing, reverse offset printing, relief printing and an inkjet method.

In the embodiments according to the present invention, materials used for a gate insulation film are not specifically limited. However, as a material generally used, a solution of polymer such as polyvinyl phenol, polymethylmethacrylate, polyimide, polyvinyl alcohol or an epoxy resin, or a solution to which particles such as alumina or silica gel is dispersed can be used. Further, a thin film made of PET, PEN or PES may be used as a gate insulation film.

In the embodiments of the present invention, materials used for the semiconductor layer are not specifically limited. However, materials generally used may include organic polymer semiconductor materials such as polythiophene, polyallylamine, fluorenebithiophene-copolymer and derivatives thereof; and low molecular organic semiconductor materials such as pentacene, tetracene, copper phthalocyanine, perylene and derivatives thereof. However, to achieve cost reduction, flexibility and large area manufacturing, an organic semiconductor material is desirable because a printing process can be used. Moreover, carbon compounds such as carbon nano-tubes or fullerene, or a semiconductor nano-sized particle dispersion may be used as a semiconductor material. As a printing process to form the organic semiconductor layer, publicly-known processes including gravure printing, offset printing, screen printing and ink-jet methods can be used. Generally, the above semiconductor materials have low solubility in a solvent, so that methods suitable for printing low viscosity solution are desirably used. The methods include relief printing, reverse offset printing, ink jet method and a dispenser. In particular, the relief printing is the most preferable since the printing period is short and an amount of ink used is small, and is suitable for printing stripe-shapes. The semiconductor layer is formed in a stripe shape, whereby a dispersion in film thickness due to the cells of the anilox can be averaged in regions having a stripe shape. Hence, the film thickness of the semiconductor layer becomes constant and TFT properties can be equalized.

In the embodiments of the present invention, materials used for interlayer insulation film are not specifically limited. However, materials generally used include acrylic resin, epoxy resin, organic/inorganic hybrid resin. For the forming method, photolithography can be used other than various printing methods such as screen printing, gravure printing and gravure offset printing. To achieve cost reduction and large area manufacturing, a printing method is preferably used. Particularly, the gravure offset printing method which is capable of forming a fine pattern with relatively large film thickness is most preferably used.

In the embodiments according to the present invention, materials used for the upper pixel electrodes are not specifically limited. Generally, the materials include thin films made of metals or oxides such as gold, platinum, nickel and indium tin oxide; or a solution in which a conductive polymer including poly (ethylenedioxythiphene)/polystyrene sulfonate (PEDOT/PSS) and polyaniline, or metal colloidal particle such as gold or silver or nickel are dispersed; or a thick film paste using metal particles such as silver as a conductive material. A method of forming the electrodes is not specifically limited, but dry film-forming such as deposition or sputtering may be used. However, considering flexibility and cost reduction, wet film-forming is preferably used, including screen printing, gravure offset printing, reverse offset printing, relief printing and an inkjet method. When considering filling via holes, screen printing or gravure offset printing is preferably used. It should be noted that the upper pixel electrode preferably has light shielding properties so that a malfunction of the transistor due to light can be prevented since the channel portions are covered. Further, the upper pixel electrode preferably covers a part of the source wiring, whereby influence of the source wiring on display operation can be suppressed, when driving the display device, for example.

In the thin film transistor array, a sealing layer or a gas barrier layer or a planarizing film may be formed as needed. In particular, in the case where an organic semiconductor material is used for a semiconductor layer, since the semiconductor layer may be damaged by a solvent or the like, depending on the material used for the interlayer insulation film, a sealing layer is preferably used.

In the thin film transistor array, source and drain are named for the sake of convenience, and thus may be named conversely. In this application, an electrode connected to the source wiring is referred to as a source electrode and an electrode connected to the pixel electrode is referred to as a drain electrode.

Hereinafter, examples will be described.

Example 1

Figure 2:
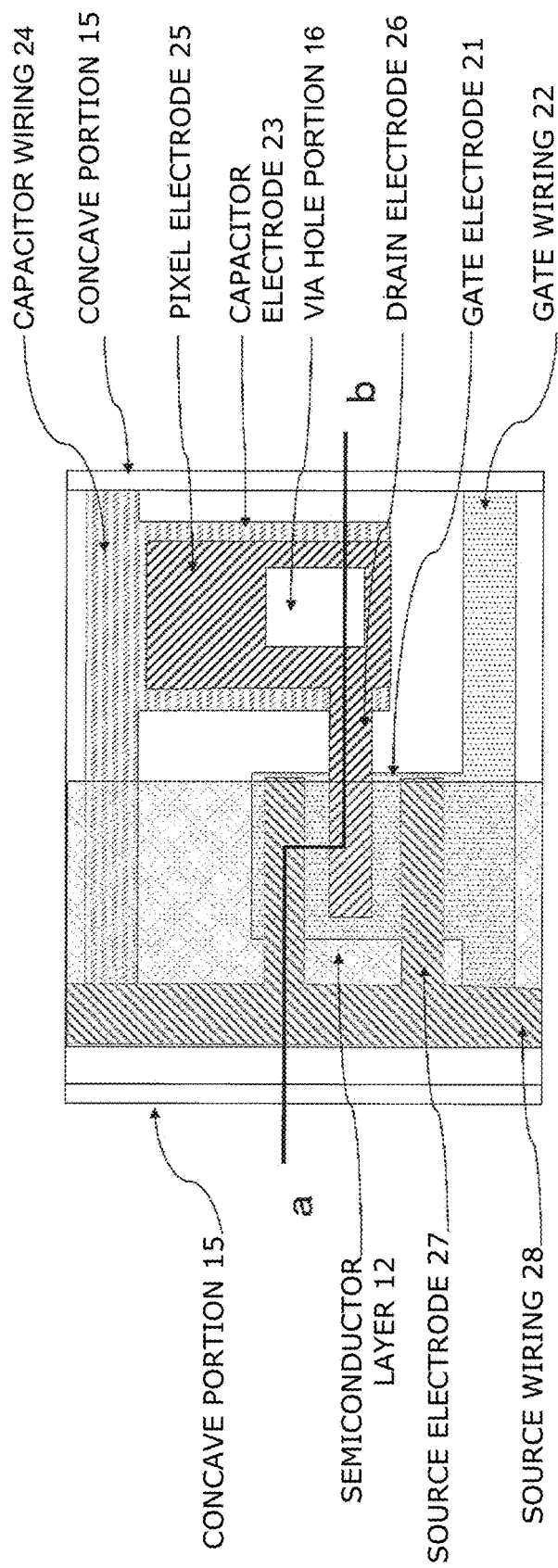
FIG. 2 is a plan view showing a detailed configuration of a single pixel shown in FIG. 1.
Figure 3:
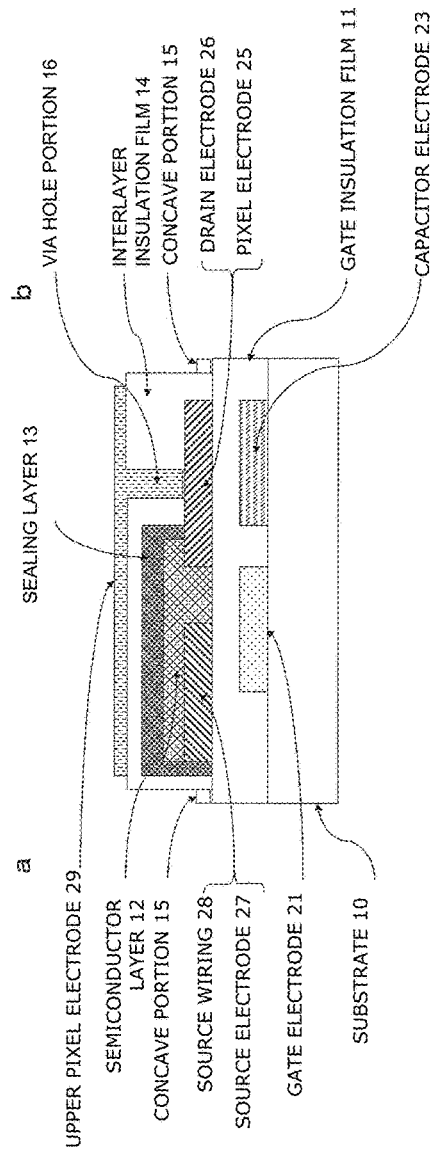
FIG. 3 is a schematic view of a cross section taken along a line a-b shown in FIG. 2.
Figure 4:
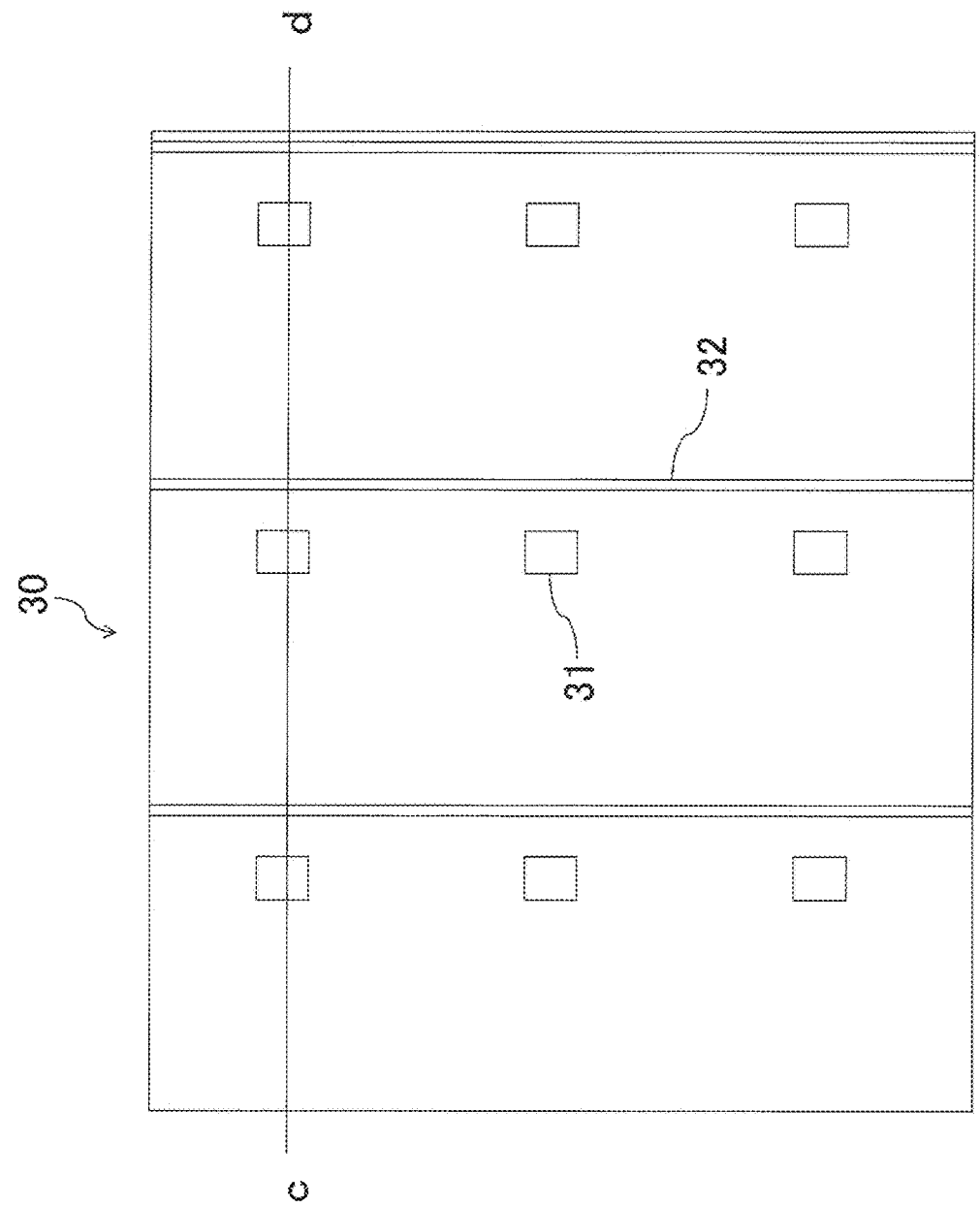
FIG. 4 is an overall schematic view of a printing intaglio for a gravure offset printing.
Figure 5:
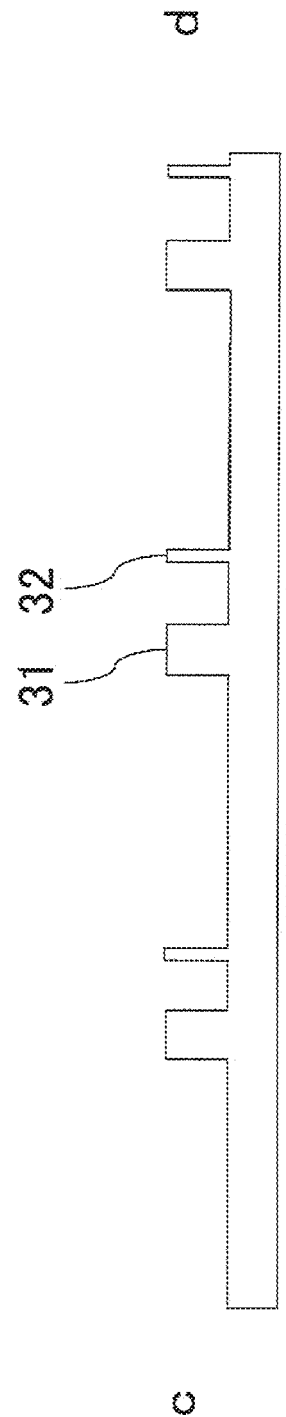
FIG. 5 is a schematic view of a cross section taken along a line c-d shown in FIG. 4.

Example 1 will now be described. In the present example, a manufacturing method of a bottom-gate bottom-contact type thin film transistor array is described. The thin film transistor array is shown in FIG. 1 (plan view), FIG. 2 (enlarged plan view for one pixel) and FIG. 3 (cross sectional view taken along the line a-b shown in FIG. 2). A polyethylene naphthalate (PEN) film was used for the substrate 10. An ink jet method using an ink where silver nanoparticles were dispersed was used to form a gate electrode 21, a gate wiring 22, a capacitor electrode 23 and a capacitor wiring 24. As a gate insulation film, a polyimide was coated by a die coater, followed by drying for one hour at 180 deg. C. so as to form a gate insulation film 11. Then, an ink jet method using an ink where silver nanoparticles were dispersed was used to form a source electrode 27, a drain electrode 26, a source wiring 28 and a pixel electrode 25. As a semiconductor material, 6, 13-Bis (triisopropylsilylethynyl) pentacene (TIPS-pentacene) was used. This material was dissolved into tetralin at 2 wt % for use as an ink. As a relief plate, a photosensitive resin relief was used to perform relief printing using an anilox roll of 150 lines to print a stripe-shaped semiconductor, followed by drying for 60 minutes at 100 deg. C. so as to form a semiconductor layer 12. Next, as a sealing material, CYTOP (manufactured by Asahi Glass Co., Ltd) of a fluorine-based resin was used to perform screen printing, followed by drying for 90 minutes at 100 deg. C., thereby forming a sealing layer 13. Subsequently, formation of the interlayer insulation film will be described. The interlayer insulation film was formed by gravure offset printing. As shown in FIG. 4, the gravure offset printing intaglio 30 includes a protruding portion 31 corresponding to a via hole portion formed on the pixel electrode and a convex portion 32 corresponding to a concave portion of the interlayer insulation film having a stripe shape extending in a direction parallel to the source wiring. FIG. 5 is a schematic view of a cross section taken along the line c-d shown in FIG. 4. An epoxy resin was used as an interlayer insulation film and doctoring was performed along an extending direction of the stripe shape to print the interlayer insulation film, followed by drying for one hour at 90 deg. C., thereby forming an interlayer insulation film 14. As a result, bending due to doctoring when forming an interlayer insulation film was not found, and chipping was not found at the protruding portion 31 corresponding to the via hole portion when observing the intaglio after the printing. Also, the film thicknesses of the interlayer insulation film 14 and the concave portion 15 thereof were measured with a contact type film thickness gauge, the results of which were 10 μm and 3 μm, respectively. Next, screen printing was performed with a silver paste as an upper pixel electrode material, followed by drying for one hour at 90 deg. C. to form the upper pixel electrode 29, thereby completing the thin film transistor.

Example 2

Figure 6:
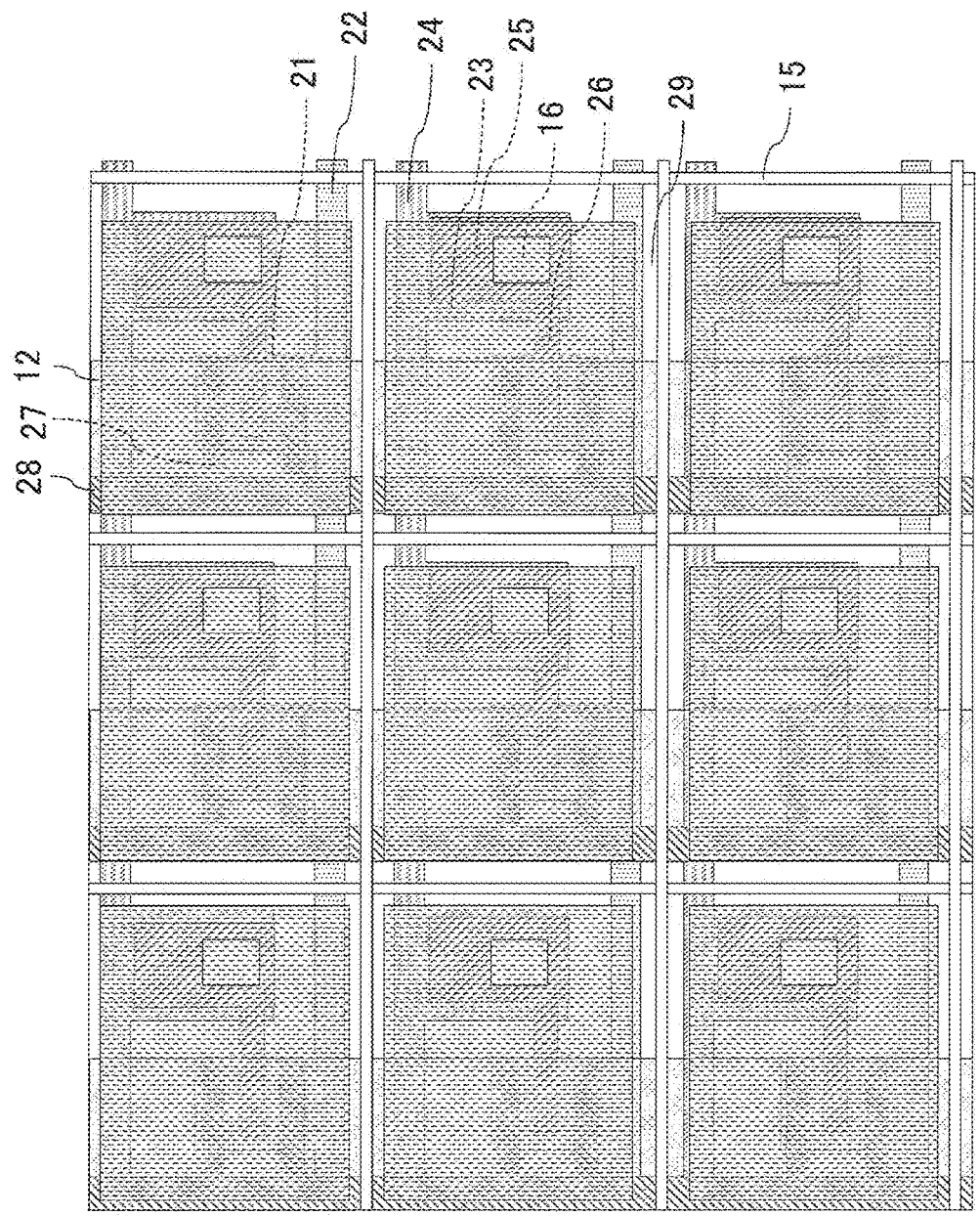
FIG. 6 is a plan view showing a second thin film transistor array of an example according to an embodiment of the present invention.
Figure 7:
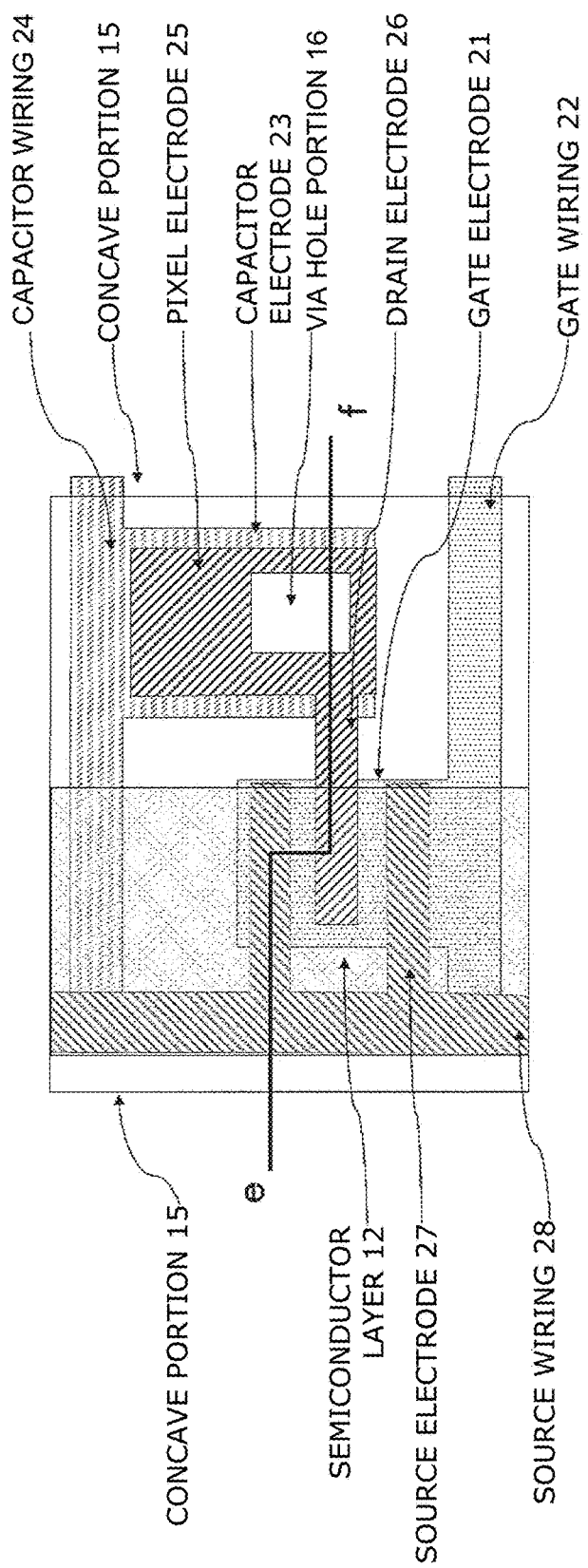
FIG. 7 is a plan view showing a detailed configuration of a single pixel shown in FIG. 6.
Figure 8:
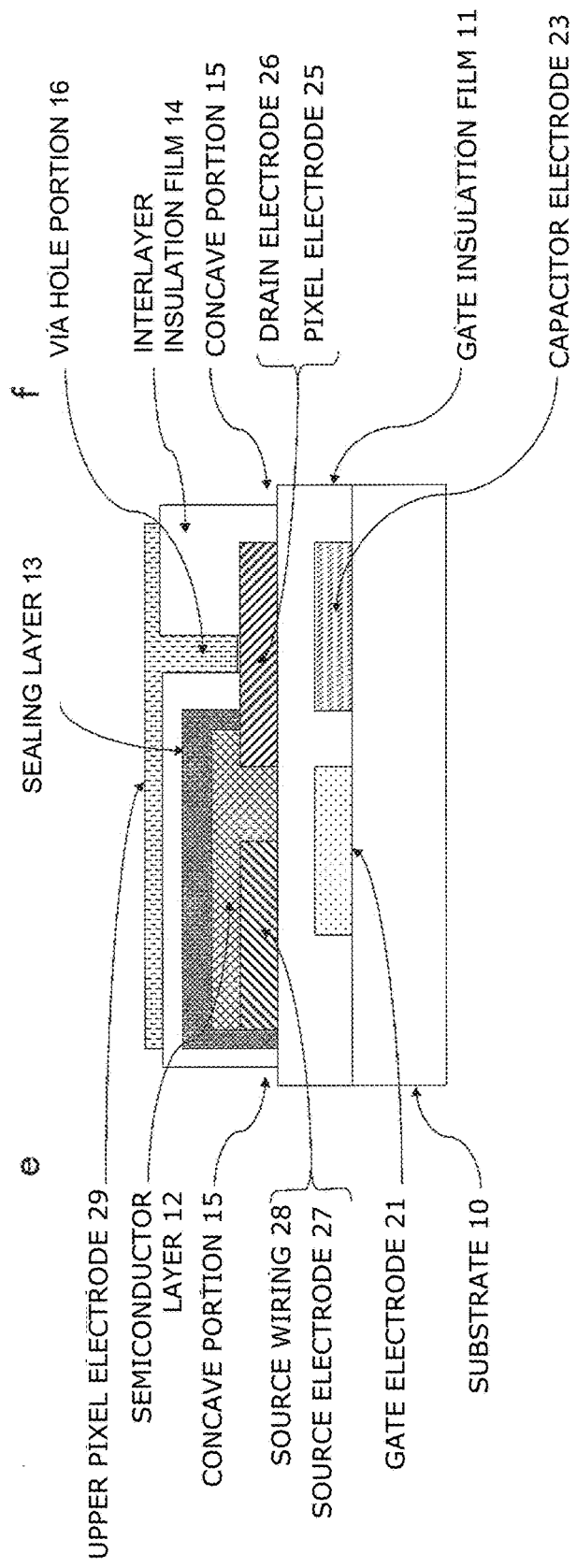
FIG. 8 is a schematic view of a cross section taken along a line e-f shown in FIG. 7.

Example 2 will now be described. In the present example, a manufacturing method of a bottom-gate bottom-contact type thin film transistor array is described. The thin film transistor array is shown in FIG. 6 (plan view), FIG. 7 (enlarged plan view for one pixel) and FIG. 8 (cross sectional view taken along the line e-f shown in FIG. 7). According to the example 1, the concave portion of the interlayer insulation film has a stripe shape parallel to the source wiring, and the concave portion does not penetrate through. However, according to the present example, the concave portion of the interlayer insulation film is formed in a lattice-shape and the concave portion reaches the lower layer. The manufacturing method is the same as the one in example 1. As a result, no bending due to doctoring when forming the interlayer insulation film was caused, and no chipping was observed at the protruding portion of the via hole portion when observing the intaglio after printing.

Example 3

Example 3 will now be described. The present example is the same as example 2 except that doctoring is performed along a direction perpendicular to the source wiring when forming the interlayer insulation film. As a result, there was no bending due to doctoring when forming an interlayer insulation film, and no chipping was observed at the protruding portion of the via hole portion when observing the intaglio after printing.

Comparative Example 1

A comparative example 1 will now be described. The comparative example 1 is the same as example 1 except that a convex portion of the interlayer insulation film was not provided. Accordingly, the gravure offset printing intaglio had only a protruding portion corresponding to the via hole portion formed on the pixel electrode. By using this printing intaglio, the interlayer insulation film was formed. As a result, the doctor was bent when doctoring was applied and the film thickness around the via hole portion was 10 μm, however, the film thickness of a center portion between via-holes was 7 μm. As a result of an observation of the intaglio, chipping was confirmed at a part of the protruding portion.

According to one or more aspects of the present invention, at least one of the following effects can be obtained. A pattern shape of the interlayer insulation film and an intaglio shape used for the gravure offset printing are optimized, whereby a pattern forming failure caused by bending of the blade or chipping of the intaglio can be reduced.

For example, when forming the interlayer insulation film by gravure offset printing, in the gravure intaglio used therefor, a convex portion can be provided on a portion other than the via hole portion. Hence, bending of the blade or chipping of the intaglio can be reduced.

Further, when forming the interlayer insulation film by, for example, gravure offset printing, a convex portion having a height which is the same as that of the via hole of the gravure intaglio used for forming the interlayer insulation film can be provided. Hence, bending of the blade or chipping of the intaglio can be reduced.

For example, when forming the interlayer insulation film by gravure offset printing, the convex portions of the gravure intaglio corresponding to the concave portion are continuously provided in the doctoring direction, whereby bending of the blade or chipping of the intaglio can be reduced.

Moreover, since the concave portion is provided parallel to the source wiring, the concave portion does not cross the source wiring, and so the entire source wiring is covered by the interlayer insulation film. Therefore, for example, when driving the display device, the display operation can be suppressed from being influenced by the source wiring.

Since the concave portions are in a lattice-shape, the convex portions of the gravure intaglio corresponding to the concave portions are in a lattice-shape as well, so that the convex portions are continuously provided with respect to the doctoring direction regardless of the printing direction. As a result, bending of the blade or chipping of the intaglio can be reduced.

Further, the upper pixel electrode is formed between the stripe-shaped concave portions, whereby a short circuit between the source wiring and the upper pixel electrode can be prevented. Moreover, in the case where the concave portion is provided parallel to the source wiring, the upper pixel electrode and the source wiring are not short-circuited even when the upper pixel electrode is formed on the concave portion. However, considering the case where the upper pixel electrode is formed, especially, by a printing method, when the upper pixel electrode is formed on the front surface having variations in film thicknesses, the pattern accuracy may degrade due to flowing paste or the like. Therefore, it is preferable that the upper pixel electrode is formed not to overlap the concave portion.

Since the upper pixel electrode is formed between the lattice-shaped concave portions, a short circuit between the source wiring and the upper pixel electrode can be prevented. Moreover, for example, in the case where the source wiring is covered by the sealing layer or the like, the upper pixel electrode and the source wiring are not short-circuited. However, considering the case where the upper pixel electrode is formed, especially, by a printing method, when the upper pixel electrode is formed on the front surface having variations in film thicknesses, the pattern accuracy may degrade due to flowing paste or the like. Therefore, it is preferable that the upper pixel electrode is formed not to overlap the concave portion.

Since the semiconductor layer has a stripe-shape parallel to the source wiring, in the case where the semiconductor layer is formed, especially, by the printing method, a thin film transistor can be manufactured with high throughput and high alignment accuracy, and a thin film transistor having high On/Off ratio can be manufactured in which variation among transistor elements are small. It should be noted that if the semiconductor layer of the thin film transistor has a stripe shape formed in a direction perpendicular to the source wiring, adjacent source wirings are connected by the semiconductor layer. Accordingly, for example, in driving the display device, current flows when different voltage potentials are applied to the adjacent source wirings. For this reason, this is unfavorable Furthermore, the interlayer insulation film is formed with a gravure offset printing, thereby manufacturing relatively thick interlayer with the fine via hole portion with high throughput and at low cost.

In one aspect of the present invention, as a result of keen research into pattern shape and an intaglio shape, a method has been discovered where a pattern can be formed without bending the blade and chipping the intaglio when forming a hole-opened pattern such as an interlayer insulation film pattern using gravure offset printing.

The first aspect of the invention in order to solve the above-described problems is a thin film transistor array including thin film transistors arranged in a matrix. Each thin film transistor includes a gate electrode formed on a substrate; a gate insulation layer formed on the gate electrode; a source electrode, and a drain electrode connected to a pixel electrode, the source electrode, the drain electrode and the pixel electrode being formed on the gate insulation layer; a semiconductor layer formed between the source electrode and the drain electrode; an interlayer insulation film formed so as to cover the source electrode, the drain electrode, the semiconductor layer and a part of the pixel electrode; and an upper pixel electrode formed on the interlayer insulation film, the upper pixel electrode being connected to the pixel electrode. The gate electrode is connected to a gate wiring and the source electrode is connected to a source wiring, and the interlayer insulation film has a concave portion.

According to the second aspect of the invention, the concave portion reaches a lower layer.

According to the third aspect of the invention, the concave portion is formed in a stripe shape.

According to the fourth aspect of the invention, the concave portion formed in the stripe shape is provided parallel to the source wiring.

According to the fifth aspect of the invention, the concave portion is formed in a lattice shape.

According to the sixth aspect of the invention, the upper pixel electrode is formed between the concave portions of the interlayer insulation film having the stripe shape.

According to the seventh aspect of the invention, the upper pixel electrode is formed between the concave portions of the interlayer insulation film having the lattice shape.

According to the eighth aspect of the invention, the semiconductor layer has a stripe-shape formed parallel to the source wiring.

The ninth aspect of the invention is a manufacturing method of the thin film transistor array, in which the interlayer insulation film is formed by a gravure offset printing method.

As described, according to the present invention, the shape of the interlayer insulation film and the intaglio shape used for the gravure offset printing are optimized, whereby pattern forming failure caused by bending of the blade or chipping of the intaglio can be reduced.

As an effect of the first aspect of the invention, when forming the interlayer insulation film with, for example, gravure offset printing, the gravure intaglio used therefor is able to include a convex portion other than the protruding portion to make a via-hole. Hence, bending of the blade or chipping of the intaglio can be reduced.

As an effect of the second aspect of the invention, when forming the interlayer insulation film by, for example, gravure offset printing, a convex portion having a height which is the same as the protrusion of the making via-hole portion of the gravure intaglio used for forming the interlayer insulation film can be provided. Hence, blade bending or intaglio chipping can be reduced.

As an effect of the third aspect of the invention, when forming the interlayer insulation film with, for example, gravure offset printing, the convex portions of the gravure intaglio corresponding to the concave portions are continuously provided in the doctoring direction, whereby bending of the blade or chipping of the intaglio can be reduced.

As an effect of the fourth aspect of the invention, since the concave portion is provided parallel to the source wiring, the concave portion does not cross the source wiring so that the source wiring is entirely covered by the interlayer insulation film. Therefore, for example, when driving the display device, influence of the source wiring on display operation can be suppressed.

As an effect of the fifth aspect of the invention, since the concave portions are in a lattice shape, the convex portions of the gravure intaglio corresponding to the concave portions are in a lattice-shape as well so that the convex portions are continuously provided with any doctoring direction. As a result, bending of the blade or chipping of the intaglio can be reduced.

As an effect of the sixth aspect of the invention, the upper pixel electrode is formed between the stripe-shaped concave portions, whereby short circuit between the source wiring and the upper pixel electrode can be prevented. Moreover, in the case where the concave portion is provided parallel to the source wiring, the upper pixel electrode and the source wiring are not short-circuited even when the upper pixel electrode is formed on the concave portion. However, considering the case where the upper pixel electrode is formed, especially, by a printing method, when the upper pixel electrode is formed on the front surface having variations in film thicknesses, the pattern accuracy may be degraded due to paste flow or the like. Therefore, it is preferable that the upper pixel electrode is formed not to overlap the concave portion.

As an effect of the seventh aspect of the invention, since the upper pixel electrode is formed between the lattice-shaped concave portions, a short circuit between the source wiring and the upper pixel electrode can be prevented. Moreover, for example, in the case where the source wiring is covered by the sealing layer or the like, the upper pixel electrode and the source wiring are not short-circuited even if the upper pixel electrode is overlapped on the concave portion. However, considering the case where the upper pixel electrode is formed, especially, by a printing method, when the upper pixel electrode is formed on the front surface having variations in film thicknesses, the pattern accuracy may degrade due to flowing paste or the like. Therefore, it is preferable that the upper pixel electrode is formed not to overlap the concave portion.

As an effect of the eighth aspect of the invention, since the semiconductor layer has a stripe-shape formed parallel to the source wiring, in the case where the semiconductor layer is formed by the printing method, a thin film transistor can be manufactured with high throughput and high alignment accuracy, and a thin film transistor having high On/Off ratio can be manufactured in which variations among transistor elements are small. It should be noted that if the semiconductor layer of the thin film transistor has a stripe shape formed in a direction perpendicular to the source wiring, adjacent source wirings are connected by the semiconductor layer. Accordingly, for example, when driving the display device, current flows when different voltage potentials are applied to the adjacent source wirings. For this reason, this direction is unfavorable.

As an effect of the ninth aspect of the invention, by the interlayer insulation film is formed using a gravure offset printing, we can manufacture relatively thick interlayer with the fine via hole portion with high throughput and low cost.

INDUSTRIAL APPLICABILITY

The present invention can be applicable to electronic equipment such as various display devices using thin film transistors.

REFERENCE SIGNS LIST

10: substrate
11: gate insulation film
12: semiconductor layer
13: sealing layer
14: interlayer insulation film
15: concave portion
16: via hole portion
21: gate electrode
22: gate wiring
23: capacitor electrode
24: capacitor wiring
25: pixel electrode
26: drain electrode
27: source electrode
28: source wiring
29: upper pixel electrode
30: gravure offset printing intaglio
31: protrusion corresponding to via hole portion
32: convex portion corresponding to concave portion Obviously, numerous modifications and variations of the present invention are possible in light of the above teachings. It is therefore to be understood that within the scope of the appended claims, the invention may be practiced otherwise than as specifically described herein.

What is claimed is:
1. A thin film transistor array, comprising:
a plurality of thin film transistors positioned in a matrix, each of the thin film transistors including
a substrate;
a gate electrode formed on the substrate;
a gate insulation layer formed on the gate electrode;
a source electrode formed on the gate insulation layer;
a drain electrode formed on the gate insulation layer;
a pixel electrode formed on the gate insulation layer and connected to the source electrode and the drain electrode;
a semiconductor layer formed between the source electrode and the drain electrode;
an interlayer insulation film covering the source electrode, the drain electrode, the semiconductor layer and a portion of the pixel electrode; and
an upper pixel electrode formed on the interlayer insulation film and connected to the pixel electrode,
wherein the interlayer insulation film has at least one concave portion and at least one via hole portion.
2. The thin film transistor array of claim 1, wherein the interlayer insulation film is formed such that the at least one concave portion exposes a portion of the gate insulation layer.
3. The thin film transistor array of claim 1, wherein the interlayer insulation film is formed such that the at least one concave portion is a plurality of concave portions formed in a stripe shape.

4. The thin film transistor array of claim 3, wherein the interlayer insulation film is formed such that the concave portions are formed in parallel to a source wiring connected to the source electrode.

5. The thin film transistor array of claim 1, wherein the interlayer insulation film is formed such that the at least one concave portion is a plurality of concave portions formed in a lattice shape.

6. The thin film transistor array of claim 3, wherein the upper pixel electrode is formed between the concave portions formed in the stripe shape.

7. The thin film transistor array of claim 5, wherein the upper pixel electrode is formed between the concave portions formed in the lattice shape.

8. The thin film transistor array of claim 1, wherein the semiconductor layer has a stripe pattern formed in parallel to a source wiring connected to the source electrode.

9. A method of manufacturing the thin film transistor array of claim 1, comprising:
  forming the gate electrode on the substrate;
  forming the gate insulation layer on the gate electrode;
  forming the source electrode on the gate insulation layer;
  forming the drain electrode on the gate insulation layer;
  forming the pixel electrode on the gate insulation layer such that the pixel electrode is connected to the drain electrode;
  forming the semiconductor layer between the source electrode and the drain electrode;
  forming the interlayer insulation film such that the interlayer insulation film covers the source electrode, the drain electrode, the semiconductor layer, and the portion of the pixel electrode; and
  forming the upper pixel electrode on the interlayer insulation film such that the upper pixel electrode is connected to the pixel electrode,
  wherein the forming of the interlayer insulation film is performed by a gravure offset printing method such that the interlayer insulation film has the at least one concave portion and the at least one via hole portion.

10. The thin film transistor array of claim 1, wherein the at least one concave portion and the at least one via hole portion are distinct portions.

11. A method of manufacturing a thin film transistor array, comprising:
  forming a gate electrode on a substrate;
  forming a gate insulation layer on the gate electrode;
  forming a source electrode on the gate insulation layer;
  forming a drain electrode on the gate insulation layer;
  forming a pixel electrode on the gate insulation layer such that the pixel electrode is connected to the drain electrode;
  forming a semiconductor layer between the source electrode and the drain electrode;
  forming an interlayer insulation film such that the interlayer insulation film covers the source electrode, the drain electrode, the semiconductor layer, and a portion of the pixel electrode; and
  forming an upper pixel electrode on the interlayer insulation film such that the upper pixel electrode is connected to the pixel electrode,
  wherein the forming of the interlayer insulation film comprises performing a gravure offset printing with an intaglio having at least one convex portion and at least one protruding portion such that the at least one convex portion forms at least one concave portion and the at least one protruding portion forms at least one via hole portion at corresponding positions in the interlayer insulation film.

12. The method of claim 11, wherein the forming of the interlayer insulation film comprises forming the at least one concave portion such that the at least one concave portion exposes a portion of the gate insulation layer.

13. The method of claim 11, wherein the forming of the interlayer insulation film comprises forming the at least one concave portion in a plurality in a stripe shape.

14. The method of claim 13, wherein the forming of the interlayer insulation film comprises forming the concave portions in parallel to a source wiring connected to the source electrode.

15. The method of claim 11, wherein the forming of the interlayer insulation film comprises forming the at least one concave portion in a plurality in a lattice shape.

16. The method of claim 13, wherein the forming of the upper pixel electrode is performed such that the upper pixel electrode is formed between the concave portions formed in the stripe shape.

17. The method of claim 15, wherein the forming of the upper pixel electrode is performed such that the upper pixel electrode is formed between the concave portions formed in the lattice shape.

18. The method of claim 11, wherein the forming of the semiconductor layer comprises forming the semiconductor layer in a stripe pattern in parallel to a source wiring connected to the source electrode.

19. A thin film transistor array produced by the method of claim 11.

* * * * *